United States Patent [19]
Lee

[11] Patent Number: 5,257,222
[45] Date of Patent: Oct. 26, 1993

[54] ANTIFUSE PROGRAMMING BY TRANSISTOR SNAP-BACK

[75] Inventor: Roger R. Lee, Boise, Id.

[73] Assignee: Micron Technology, Inc., Boise, Id.

[21] Appl. No.: 821,501

[22] Filed: Jan. 14, 1992

[51] Int. Cl.$^5$ .............................................. G11C 17/00
[52] U.S. Cl. .................................. 365/96; 365/225.7; 257/530
[58] Field of Search ................... 257/530, 50; 365/96, 365/103, 104, 225.7

[56] References Cited

U.S. PATENT DOCUMENTS 5,163,180 11/1992 Eltowkhy et al. .................. 257/530

*Primary Examiner*—Joseph A. Popek
*Attorney, Agent, or Firm*—David J. Paul

[57] ABSTRACT

The present invention comprises a method to program antifuse elements in integrated circuits, such as programmable read-only memory (PROM) or option selections/redundancy repair on dynamic random access memories (DRAMs) by utilizing the phenomenon of transistor snap-back. Multiple programming pulses are applied to an NMOS transistor which provides access to the desired antifuse element. The first pulses applied ruptures the antifuse element causing it so become a resistive short. The second programming pulses cause the access NMOS transistor to go into snap-back thus allowing a surge of current to flow through the resistively shorted antifuse thereby lowering the resistance of the shorted antifuse element substantially allowing for less power consumption and higher reliability of the permanently programmed element.

22 Claims, 1 Drawing Sheet

ANTIFUSE PROGRAMMING BY TRANSISTOR SNAP-BACK

FIELD OF THE INVENTION

This invention relates to the field of semiconductor devices. More specifically, a concept is described which allows programming of antifuse elements in semiconductor devices, such as non-volatile memory devices, by utilizing transistor snap-back.

BACKGROUND OF THE INVENTION

A read only memory (ROM) consists of an array of semiconductor devices (diodes, bipolar or field-effect transistors) which interconnect to store an array of binary data (ones or zeros). A ROM basically consists of a memory array of programmed data and a decoder to select the data located at a desired address in the memory array.

Though there are three basic types of ROMs, mask-programmable ROMs, erasable programmable ROMs (EPROMs) and field-programmable ROMs (PROMs), the focus of the present invention is on PROMs.

PROMs are typically manufactured with all switching elements present in the array, with the connection at each row-column intersection being made by means of either a fuse element or an antifuse element. In order to store data in the PROM, these elements (either the fuse or the anti-fuse, whichever are used in the design) are selectively programmed using appropriate voltage pulses supplied by a PROM programmer. Once the elements are programmed, the data is permanently stored in the memory array.

However there is a major problem with a conventionally programmed antifuse. Typically a programmed antifuse element has a resistance of several thousand ohms and cannot be reduced further without allowing a large amount of current to flow through it. Because the access transistor will limit the current to the order of a few hundred microamps, a low resistive antifuse of several hundred ohms can not be obtained through conventional methods. The larger the resistance of a programmed antifuse element in a memory cell the harder it becomes to read the data that is permanently programmed in due to the voltage drop lost across the resistive antifuse. Thus it is desirable to create the lowest resistive antifuse as possible.

SUMMARY OF THE INVENTION

The present invention provides a method of programming one time programmable elements, such as fuse or antifuse elements, with multiple programming pulses by using transistor snap-back rather than using the conventional method of applying a single external voltage programming pulse. Though this method can be applied to programming fuse elements is it certainly more practical to apply this method for programming antifuse elements, which will be the focus of the discussion that follows.

A transistor operating in a snap-back condition theoretically will allow an infinite amount of current to flow through the transistor's channel region and is limited only by the power source capabilities. And very importantly, studies have shown that a transistor operating during snap-back is not damaged if operated under AC pulse conditions. Taking advantage of transistor snap-back, as described in the present invention, thus reduces the resistivity of a programmed antifuse element to the desirable level of several hundred ohms.

As depicted in FIG. 1, the family of $i_D - v_{DS}$ characteristic curves show a snap-back condition occurs in NMOS transistors when the transistor's drain voltage ($V_D$) approaches 14 v with the gate voltage ($V_G$) at approximately 8 v. As the curve indicates at the point labeled 11, the drain current ($I_D$) rapidly approaches saturation at the point labeled 12. $I_D$ is limited by power capabilities of the source of the programming pulses and the physical constraints of the NMOS device's ability to carry current without being destroyed. Utilizing this large surge of current during the programming stage of PROM memory cell is the key advantage of the present invention, as will be discussed later. Also, one skilled in the art may use PMOS access transistors simply by changing the programming voltages to the appropriate PMOS biasing levels.

Though the present invention suggests using the transistor snap-back programming method to program antifuse elements in a PROM it will be obvious to one skilled in the art to implement this approach into other programmable integrated circuits, such as programmable logic arrays (PLAs), programmable array logic (PALs), dynamic random access memories (DRAMs) and the like or simply logic circuits in general. For example, in DRAMs antifuse elements may be designed into the circuitry in order to provide means for redundancy repair or selecting certain options. The transistor snap-back method of programming these elements described could easily be implemented to program the desired antifuse elements present in the DRAM.

DETAILED DESCRIPTION OF THE PREFERRED EMBODIMENT

Figure 1:
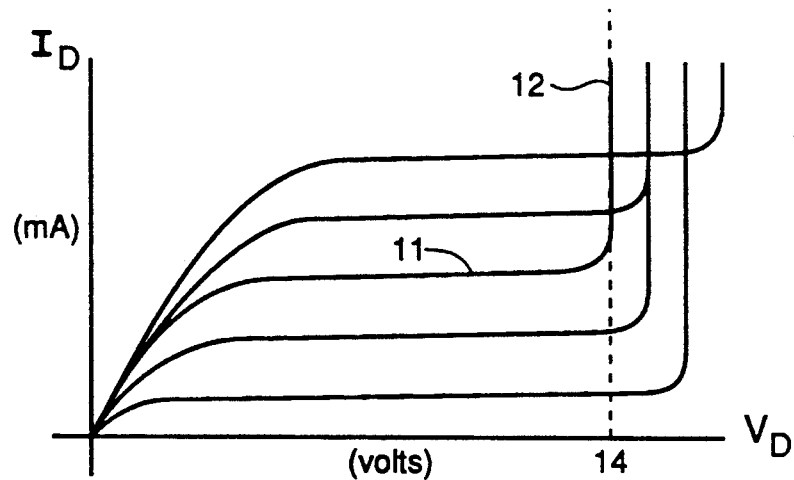
FIG. 1 shows a family of $i_D - v_{DS}$ characteristic curves of a typical NMOS transistor depicting its snap-back region.
Figure 2:
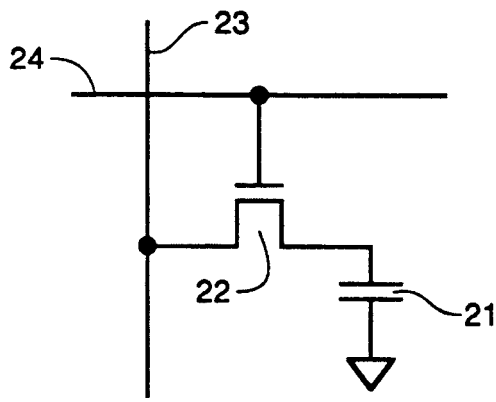
FIG. 2 shows a typical schematical representation of a programmable element connected to an NMOS transistor which is in turn connected to a word line and a digit line.

FIG. 2 depicts a schematical representation of a typical memory element in a PROM wherein antifuse element 21 is the element available for programming. Antifuse element 21 is connected to the source of NMOS transistor 22. The drain of NMOS 22 is connected to one of the memory array's digit lines 23 while the gate is connected to one of the word lines 24.

Figure 3:
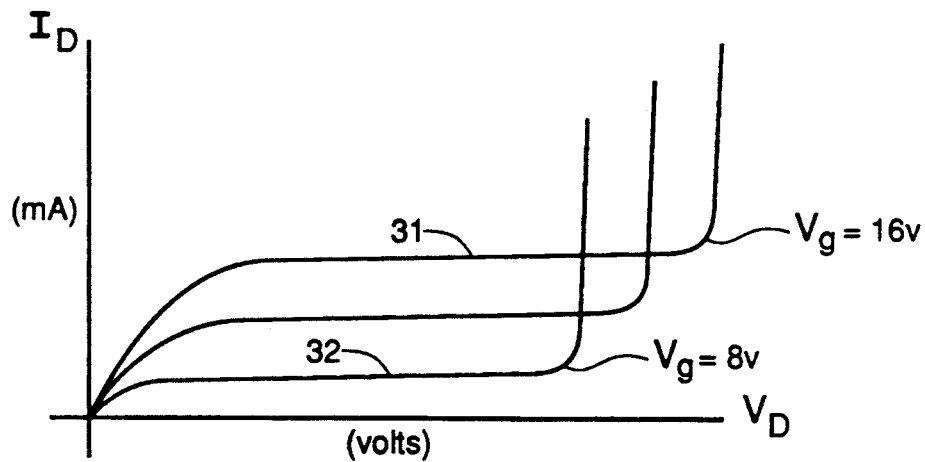
FIG. 3 shows the family of $i_D - v_{DS}$ characteristics depicting the desired conditions used to apply multiple programming pulses to the source and gate of the NMOS transistor.

FIG. 3 shows the family of $i_D - i_{DS}$ characteristics depicting the desired conditions used to apply multiple programming pulses to the source and gate of the NMOS transistor 22. A first programming pulse of 14 v is applied to the drain of NMOS 22 while the gate voltage is held at 16 v (identified by characteristic curve 31). Under these conditions the voltage developed across antifuse 21 is great enough to cause it to rupture and thus become a resistive short thereby shorting the source of NMOS transistor 22 to ground. Next, a second programming pulse of 14 v is applied, again to the drain of NMOS transistor 22, but now the gate voltage is lowered to 8 v (identified by characteristic curve 32).

The effect of the lower gate voltage creates a snap-back condition for NMOS transistor 22. With NMOS transistor now in snap-back a large surge of drain current ($I_D$) flows through the channel of NMOS transistor 22 and thus through the programmed antifuse element 21. This large surge of drain current greatly reduces (approximately by one order of magnitude) the resistance of resistively shorted antifuse element 21, thereby reducing the power loss at antifuse 21 and thus improving the efficiency and reliability of the PROM's memory cell. NMOS transistor 22 returns to normal operation once the programming pulse returns to 0 v or is removed. The second programming pulse is only present at the drain for a matter of microseconds therefore eliminating any possible damage to NMOS transistor 22. It is also possible to apply a constant voltage level to the drain and then apply the appropriate programming voltage pulses to the gate. The biasing voltages and programming pulses must be such that the threshold voltage of NMOS transistor 22 is overcome and thereby turned on. Also a sufficient level of voltage must develop across antifuse element 21 in order to cause it to rupture. Although in the present invention a programming pulse of 14 v was needed to cause element 21 to rupture, the voltage level and pulse width will vary according to the dielectric thickness used to fabricate the antifuse.

It would be advantageous to get a lower snap-back voltage in order to create a higher snap-back current as well as allowing for a simpler circuit design by utilizing such processes know to those skilled in the art as NON-LDD or by providing a higher operating substrate current. Simply put, the higher the snap-back current the lower the resistance of the programmed antifuse element.

It is to be understood that although the present invention has been described with reference to a preferred embodiment, various modifications known to those skilled in the art, such as adjusting the programming voltage or using this technique for other integrated circuits that utilize programmable antifuse elements, may be made to the method presented herein without departing from the invention as recited in the several claims appended hereto.

I claim:

1. A method to program a one time programmable element in an integrated circuit, said method comprising the steps of:
   a) applying a first biasing voltage to a first terminal of said transistor;
   b) applying a first voltage pulse to a second terminal of said transistor, said applications of first biasing voltage and said first voltage pulse cause said programmable element to rupture;
   c) applying a second biasing voltage to said transistor's first terminal, said second biasing voltage is at a potential less than that of said first biasing voltage; and
   d) applying a second voltage pulse to said transistor's second terminal thereby causing transistor snap-back which allows a surge of current to flow through said ruptured element.

2. The method of claim 1 wherein said programmable element is a programmable antifuse.

3. The method of claim 1 wherein said programmable element is a programmable fuse.

4. The method of claim 1 wherein said integrated circuit is a non-volatile memory device.

5. The method of claim 4 wherein said non-volatile memory device is a programmable read only memory.

6. The method of claim 1 wherein said integrated circuit is a dynamic random access memory.

7. The method of claim 1 wherein said transistor is a field effect metal oxide transistor.

8. The method of claim 7 wherein said field effect metal oxide transistor is an n-channel device with said first terminal being a gate terminal and said second terminal being a drain terminal.

9. The method of claim 7 wherein said field effect metal oxide transistor is an n-channel device with said first terminal being a drain terminal and said second terminal being a gate terminal.

10. The method of claim 1 wherein the difference between said first biasing voltage and said first voltage pulse is greater than the threshold voltage of said transistor, thereby turning on said transistor.

11. The method of claim 1 wherein the difference between said second biasing voltage and said second voltage pulse is greater than the threshold voltage of said transistor, thereby forcing said transistor to operate in said snap-back condition.

12. A method to program a one time programmable antifuse element in an integrated circuit, said method comprising the steps of:
   a) applying a first biasing voltage to a first transistor's terminal;
   b) applying a first voltage pulse to a second terminal of said transistor, said applications of first biasing voltage and said first voltage pulse cause said antifuse element to rupture thereby becoming a resistive short;
   c) applying a second biasing voltage to said transistor's first terminal, said second biasing voltage being at a potential less than that of said first biasing voltage; and
   d) applying a second voltage pulse to said second transistor terminal thereby causing transistor snap-back which allows a surge of current to flow through said resistive short and thereby reducing the resistance by approximately one order of magnitude.

13. The method of claim 12 wherein said integrated circuit is a non-volatile memory device.

14. The method of claim 13 wherein said non-volatile memory device is a programmable read only memory.

15. The method of claim 12 wherein said integrated circuit is a dynamic random access memory.

16. The method of claim 12 wherein said transistor is a field effect metal oxide transistor.

17. The method of claim 16 wherein said field effect metal oxide transistor is an n-channel device with said first terminal being a gate terminal and said second terminal being a drain terminal.

18. The method of claim 16 wherein said field effect metal oxide transistor is an n-channel device with said first terminal being a drain terminal and said second terminal being a gate terminal.

19. The method of claim 12 wherein said first and second biasing voltages are applied via a digit line and said first and second voltage pulses are applied via a word line.

20. The method of claim 12 wherein said first biasing voltage is approximately 16 v and said first voltage pulse is approximately 14 v.

21. The method of claim 12 wherein said second biasing voltage is approximately 8 v and said second voltage pulse is approximately 14 v.

22. A method to program an antifuse element in a programmable read only memory, said method comprising the steps of:
  a) applying a first gate voltage via a word line to the gate of an NMOS transistor;
  b) applying a first voltage pulse via a digit line to the drain of said NMOS transistor, said applications of first gate voltage and said first voltage pulse cause said antifuse element to rupture thereby becoming a resistive short;
  c) applying a second gate voltage via said word line to said gate of said NMOS transistor, said second gate voltage being at a potential less than that of said first gate voltage; and
  d) applying a second voltage pulse to said transistor's drain thereby causing transistor snap-back which allows a surge of drain current to flow through said resistive short and thereby reducing the resistance by approximately one order of magnitude.

* * * * *